United States Patent
Tamatsuka

(12) 
(10) Patent No.: US 6,224,668 B1
(45) Date of Patent: May 1, 2001

(54) METHOD FOR PRODUCING SOI SUBSTRATE AND SOI SUBSTRATE

(75) Inventor: Masaro Tamatsuka, Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/313,858

(22) Filed: May 18, 1999

(30) Foreign Application Priority Data

Jun. 2, 1998 (JP) .................................................. 10-169309

(51) Int. Cl.⁷ ...................................................... C30B 25/00
(52) U.S. Cl. .................................. 117/84; 117/89; 117/94
(58) Field of Search ................... 117/84, 89, 94

(56) References Cited

FOREIGN PATENT DOCUMENTS

| 2-267195 | 10/1990 | (JP) | .............................. | C30B/29/06 |
| 4-192345 | 7/1992 | (JP) | .............................. | H01L/21/66 |
| 5-211128 | 8/1993 | (JP) | .............................. | H01L/21/205 |

*Primary Examiner*—Felisa Hiteshew
(74) *Attorney, Agent, or Firm*—Hogan & Hartson, LLP

(57) ABSTRACT

There are disclosed a method for producing an SOI substrate comprising forming an oxide layer on a surface of at least one silicon wafer among two silicon wafers, closely contacting one wafer with the other wafer so that the oxide layer should be interposed between them, subjecting the wafers to a heat treatment to firmly bond the wafers, and making a device processing side wafer thinner to a desired thickness, wherein a silicon single crystal wafer obtained by growing a silicon single crystal ingot doped with nitrogen by the Czochralski method, and slicing the single crystal ingot into a silicon single crystal wafer is used as the device processing side wafer, and an SOI substrate produced by the method. The present invention provides a method for producing SOI substrates, in particular thin film SOI substrates having an SOI layer thickness of 1 $\mu$m or less, exhibiting a small crystal defect size in the SOI layer, and SOI substrates with low cost and high productivity.

14 Claims, 2 Drawing Sheets

METHOD FOR PRODUCING SOI SUBSTRATE AND SOI SUBSTRATE

BACKGROUND OF THE INVENTION

1. Field of the Invention

The present invention relates to a method for producing a bonded SOI substrate utilizing a silicon single crystal wafer produced by the Czochralski method (referred to as the "CZ method" hereinafter), and a bonded SOI substrate. In particular, the present invention relates to a method for producing a thin film SOI substrate having an SOI layer thickness of 1 $\mu$m or less, wherein the size of crystal defects called grown-in defects in the SOI layer is made smaller, and therefore the defects can be easily eliminated by means of heat treatment, and an SOI substrate produced by the method.

2. Description of the Related Art

As a technique for bonding two pieces of silicon single crystal wafers with an interposed silicon oxide layer, there has been known a method disclosed in, for example, Japanese Patent Application Publication (KOKOKU) No. 5-46086, which comprises forming an oxide layer on at least one wafer, closely contacting them with each other while eliminating any foreign substances from the bonding surfaces, and subjecting them to a heat treatment at a temperature of about 200–1200° C. to enhance the bonding strength.

Because a bonded substrate whose bonding strength has been enhanced by a heat treatment can subsequently be processed by, for example, grinding, polishing or the like, either one of the wafers can be made thinner to a desired thickness by grinding, polishing or the like to afford an SOI layer on which devices are formed.

That is, because the produced SOI substrate contains bulk crystals of the silicon single crystal wafer exhibiting excellent crystallinity as they are, the obtained SOI layer would exhibit excellent crystallinity, and this characteristic is more advantageous compared with other SOI production methods such as the SIMOX (Separation by Implanted Oxygen) method and the fusion recrystallization method.

On the other hand, as the starting material of bonded substrates, i.e., silicon single crystal wafers, those silicon single crystal wafers obtained by slicing a single crystal ingot grown by the Czochralski method (CZ method) have been mainly used.

However, it has recently been reported that, in silicon single crystals grown by the CZ method, crystal defects introduced during the crystal growth and called grown-in defects as mentioned above were detected by various measuring methods. For example, as for single crystals pulled at a growth rate generally used for the commercial production (for example, about 1 mm/min or more), these crystal defects can be detected as pits by preferentially etching (Secco etching) their surfaces with Secco solution (mixed solution of $K_2Cr_2O_7$, hydrofluoric acid and water). See Japanese Patent Application Laid-open (KOKAI) No. 4-192345.

The major cause of these pits is considered to be clusters of vacancies, which aggregate during the production of single crystals, or oxide precipitates, which are aggregates of oxygen atoms contaminated from quartz crucibles. Because these crystal defects present in regions where devices are to be formed may become harmful defects that degrade device characteristics, various kinds of methods for decreasing such crystal defects have been investigated.

For example, it has been known that, in order to reduce the density of the aforementioned clusters of vacancies, the crystals may be grown at an extremely low growth rate (for example, 0.4 mm/min or less). See Japanese Patent Application Laid-open (KOKAI) No. 2-267195. However, it has been becoming clear that this method generates crystal defects that are considered dislocation loops formed by newly gathered excessive interstitial silicon, and they markedly degrade the device characteristics, which means that the method cannot be a solution of the problem. In addition, such a decrease of crystal growth rate from the conventional 1 mm/min or more to 0.4 mm/min or less invites marked decrease of the productivity and increase of the cost of single crystals.

Therefore, if an SOI substrate is produced by using a CZ wafer containing such crystal defects, the produced SOI layer of course contains crystal defects, and they degrade the electric characteristics of the SOI layer such as oxide dielectric breakdown voltage. In particular, when the substrate is a thin film SOI substrate, i.e., the SOI layer to be formed must have a thickness of, for example, 1 $\mu$m or less, the crystal defects may be present in such a manner that they penetrate the SOI layer and thus form pin holes, which markedly degrade the quality and the characteristics.

SUMMARY OF THE INVENTION

The present invention has been accomplished in view of the aforementioned problems, and its object is to provide a method for producing SOI substrates, in particular, thin film SOI substrates having an SOI layer thickness of 1 $\mu$m or less, wherein crystal defects in the SOI layer can be made smaller in their size, and easily eliminated by a heat treatment, and such SOI substrates with low cost and high productivity.

To achieve the aforementioned object, the present invention provides a method for producing an SOI substrate comprising forming an oxide layer on a surface of at least one silicon wafer among two silicon wafers, closely contacting one wafer with the other wafer so that the oxide layer should be interposed between them, subjecting the wafers to a heat treatment to firmly bond the wafers, and making a device processing (fabricating) side wafer thinner to a desired thickness, wherein a silicon single crystal wafer obtained by growing a silicon single crystal ingot doped with nitrogen by the Czochralski method, and slicing the single crystal ingot into a silicon single crystal wafer is used as the device processing side wafer.

By doping a single crystal ingot with nitrogen during growing it by the CZ method as in the aforementioned method, growth of crystal defects introduced during the crystal growth can be suppressed. Further, as a result of suppression of the growth of crystal defects, the crystal growth rate can be made faster, and hence the productivity of crystals can be markedly improved.

Further, by using a wafer obtained by processing such a silicon single crystal doped with nitrogen as a device processing side wafer of SOI substrate, an SOI substrate having an SOI layer with an extremely small crystal defect size can be obtained. Therefore, the crystal defects can be easily eliminated by subjecting the SOI substrate to a heat treatment, and quality of devices formed on the SOI layer such as electric characteristics can be markedly improved.

In the above method, because the nitrogen in the device processing side wafer to be the SOI layer is out-diffused during the heat treatment, it does not harmfully affect on devices to be formed.

The present invention also provides a method for producing an SOI substrate comprising closely contacting a silicon wafer and an insulator substrate, subjecting them to a heat treatment to firmly bond them, and making the silicon wafer that is a device processing side wafer thinner to a desired thickness, wherein a silicon single crystal wafer obtained by growing a silicon single crystal ingot doped with nitrogen by the Czochralski method, and slicing the single crystal ingot into a silicon single crystal wafer is used as the silicon wafer that is the device processing side wafer.

According to the present invention, for the production of SOI substrates where a silicon wafer and an insulator substrate are bonded to produce an SOI substrate, a silicon single crystal wafer doped with nitrogen may be used as the device processing side wafer. Also in this case, the crystal defect size in the SOI layer can be made extremely small, and the productivity of silicon wafers can be improved.

According to the present invention, when the silicon single crystal ingot doped with nitrogen is grown by the Czochralski method, concentration of nitrogen doped into the single crystal ingot is preferably controlled to be in the range of $1\times10^{10}$ to $5\times10^{15}$ atoms/cm$^3$.

This is because the nitrogen concentration is preferably $1\times10^{10}$ or more in order to sufficiently suppresses the growth of crystal defects and surely reduce the generation of pin holes in the SOI layer, and the nitrogen concentration is preferably $5\times10^{15}$ atoms/cm$^3$ or less in order not to inhibit the crystallization of silicon single crystals.

Further, when the single crystal ingot doped with nitrogen is grown by the Czochralski method, concentration of oxygen contained in the single crystal ingot is preferably controlled to be $1.2\times10^{18}$ atoms/cm$^3$ or less (value according to ASTM '79).

Use of such a low oxygen concentration further suppresses the formation of crystal defects, and hence generation of crystal defects and pin holes in the SOI layer can further be suppressed.

In the aforementioned methods for producing an SOI substrate, the heat treatment for obtaining firm bonding may be performed at a temperature of 900° C. or more.

By performing the heat treatment at a temperature in such a range, the two pieces of wafers can be bonded with sufficient strength, and the nitrogen can be surely eliminated from the region to be the SOI layer of device processing side wafer. Therefore, when it functions in an SOI substrate, nitrogen no longer harmfully affects on the electric characteristics or the like. In addition, because the heat treatment at a temperature in such a range affords a region free from defects due to oxygen in a region to be the SOI layer of the device processing side wafer, reduced defects and prevention of degradation of electric characteristics of the SOI layer due to oxygen and the like can be achieved.

In the methods for producing an SOI substrate according to the present invention, the device processing side wafer may be made thinner to a thickness of 1 μm or less.

Because pin holes are particularly likely to be formed in an extremely thin SOI layer such as one having a thickness of 1 μm or less due to the penetration of crystal defects, use of the silicon wafer doped with nitrogen according to the present invention is advantageous for such a substrate.

In the methods for producing an SOI substrate according to the present invention, after the device processing side wafer is made thinner, the heat treatment may be preformed at a temperature of 900° C. or more.

By performing the heat treatment at a temperature of 900° C. or more after the wafer has been made thinner, the crystal defects having a small size in the SOI layer can easily be eliminated.

Thus, an SOI substrate produced by the production method of the present invention would have crystal defects of an extremely small size in the SOI layer, and they can easily be eliminated by the heat treatment. Therefore, the SOI substrate of the present invention would have few crystal defects.

That is, the SOI substrate of the present invention is, for example, an SOI substrate which is produced by forming an oxide layer on a surface of at least one silicon wafer among two silicon wafers, closely contacting one silicon wafer with the other silicon wafer so that the oxide layer should be interposed between them, subjecting the wafers to a heat treatment to firmly bond the wafers, and making a device processing side wafer thinner to a desired thickness, wherein the device processing side wafer is a silicon single crystal wafer obtained by growing a silicon single crystal ingot doped with nitrogen by the Czochralski method, and slicing the single crystal ingot into a silicon single crystal wafer.

The SOI substrate of the present invention may also be an SOI substrate which is produced by closely contacting a silicon wafer with an insulator substrate, subjecting them to a heat treatment to firmly bond them, and making the silicon wafer that is a device processing side wafer thinner to a desired thickness, wherein the silicon wafer that is the device processing side wafer is a silicon single crystal wafer obtained by growing a silicon single crystal ingot doped with nitrogen by the Czochralski method, and slicing the single crystal ingot into a silicon single crystal wafer.

In the SOI substrate of the present invention, the nitrogen concentration in the device processing side wafer may be in the range of $1\times10^{10}$ to $5\times10^{15}$ atoms/cm$^3$, and the oxygen concentration in the device processing side wafer may be $1.2\times10^{18}$ atoms/cm$^3$ or less.

Even when the SOI layer has a thickness of 1 μm or less, the SOI substrate of the present invention can be an SOI substrate having an SOI layer of good quality containing particularly few pin holes.

According to the present invention, SOI substrates exhibiting a small crystal defect size in the SOI layer and having few pin holes can be obtained with high productivity and low cost by producing the SOI substrates with silicon single crystal wafers doped with nitrogen. The method of the present invention is particularly effective as a method for producing thin film SOI substrates having an SOI layer thickness of 1 um or less, in which the crystal defects and the pin holes in the SOI layer may be particularly likely to constitute problems.

DESCRIPTION OF THE INVENTION AND EMBODIMENTS

Figure 1:
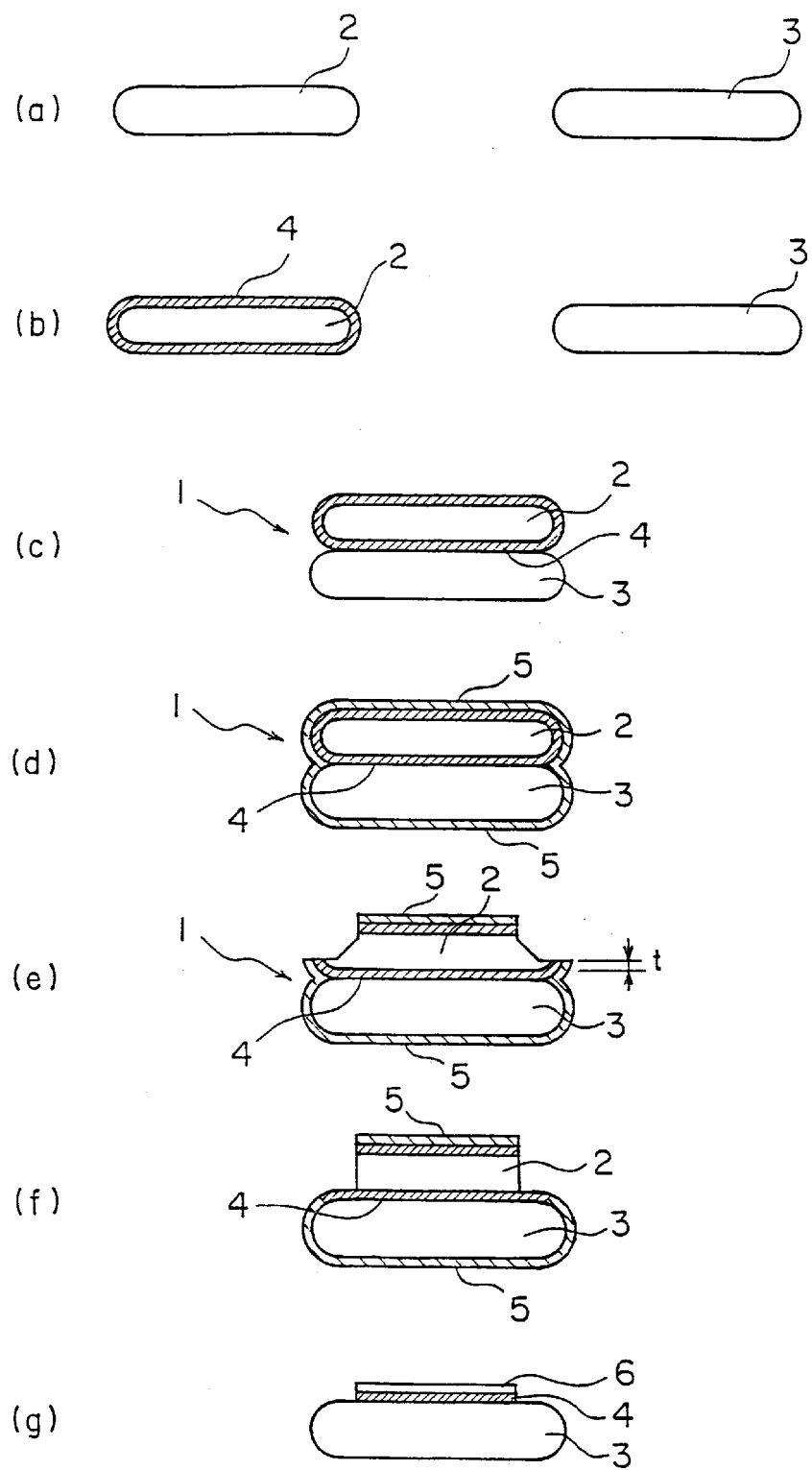
FIGS. 1(a)–(g) are explanatory views showing exemplary process steps for producing a bonded SOI substrate according to the present invention.

The present invention will be explained more in detail hereinafter, but the present invention is not limited by the following explanation.

As a technique for eliminating crystal defects in silicon wafers, there has been known a method comprising heat treatment of the wafers at a high temperature in a reducing atmosphere such as hydrogen atmosphere. However, if this technique is applied to SOI substrates, because penetrating pin holes are formed from crystal defects in the SOI layer, particularly when the SOI layer is thin, there is arisen a problem that reducing gas penetrates through the pin holes and reduces the buried oxide layer. Such reduction of the buried oxide layer destroys the SOI structure, and hence markedly degrades the electric characteristics of devices.

Therefore, according to the present invention, penetrating pin holes are reduced, not by eliminating crystal defects in the produced SOI layer, but by making the crystal defect size in the material silicon wafers smaller so that the defects should become likely to be eliminated by a heat treatment.

That is, the present invention has been accomplished based on the finding that, if a silicon single crystal wafer which has been produced by using a technique that makes the crystal defect size smaller through doping of silicon single crystal with nitrogen during its growth by the CZ method is used for a bonded SOI substrate, an SOI substrate which has an SOI layer exhibiting a small crystal defect size in the SOI layer, therefore, containing few penetrating pin holes and defects more likely to be eliminated by a heat treatment can be obtained with low cost and high productivity, and further based on investigation of various conditions therefor.

It has already been pointed out that doping of nitrogen into silicon single crystals suppresses aggregation of vacancies in silicon (T. Abe and H. Takeno, Mat. Res. Soc. Symp. Proc. Vol. 262, 3, 1992). This effect is considered to be obtained by the fact that the vacancy aggregation process resulting formation of uniform (homogenous) nuclei shifts to one resulting formation of heterogeneous nuclei. Therefore, if a silicon single crystal is doped with nitrogen during its growth by the CZ method, a silicon single crystal having a small crystal defect size can be obtained, and a silicon single crystal wafer with a small crystal defect size can be obtained by processing such a silicon single crystal. In addition, this method does not necessarily require lowering the crystal growth rate unlike the aforementioned conventional method, and therefore it may afford silicon single crystal wafers having few defects with high productivity.

However, it has been known that nitrogen atoms in silicon single crystals promote oxygen precipitation (for example, F. Shimura and R. S. Hockett, Appl. Phys. Lett. 48, 224, 1986), and when they are doped into silicon single crystal wafers produced by the CZ method, many defects due to oxygen precipitation such as OSF (oxidation-induced stacking fault) are generated in the device processing layer by heat treatment during the device processing process or the like. Therefore, CZ silicon single crystal wafers doped with nitrogen have not conventionally been used as wafers for device processing.

Therefore, according to the present invention, in order to maximize the advantage that the crystal defects (grown-in defects) are difficult to grow in nitrogen-doped crystals, wafers doped with nitrogen are used as material wafers of bonded SOI substrates. In the production of bonded SOI substrates, two pieces of wafers are closely contacted and then subjected to a heat treatment for bonding, and therefore the nitrogen is out-diffused by the heat treatment, and does not remain in the SOI layer. However, because the SOI layer is produced by utilizing the nitrogen-doped substrate, the size of the grown-in defect remains small even though the nitrogen is out-diffused. On the other hand, it has been confirmed that the defects due to oxygen are unlikely to be formed around the bonding interface, while its reason is not clear. Therefore, the density of defects due to oxygen also becomes extremely low in the region to be the SOI layer.

Furthermore, according to the present invention, it is not required to use a lower crystal pulling rate in the CZ method, and therefore material silicon wafers can be obtained with low cost and high productivity. As a result, there can be obtained an advantage that the cost of SOI substrates can be reduced.

In the method for producing the SOI substrate of the present invention, as the material wafers, i.e., silicon single crystal wafers, silicon single crystal wafers doped with nitrogen are first produced by growing a silicon single crystal ingot doped with nitrogen by the CZ method, and slicing the single crystal ingot.

In this step, growth of silicon single crystal ingot doped with nitrogen by the CZ method can be performed in a known manner described in, for example, Japanese Patent Application Laid-open (KOKAI) No. 60-251190.

That is, in the CZ method, which comprises bringing a seed crystal into contact with starting polycrystal silicon melt contained in a quartz crucible, and slowly pulling the seed crystal with rotation to grow a silicon single crystal ingot of a desired diameter, the pulled crystal can be doped with nitrogen by introducing a nitride into the quartz crucible beforehand, or adding a nitride into the melt, or employing an atmosphere containing nitrogen as the atmospheric gas. In such an operation, the doping amount in the crystal can be controlled by adjusting the amount of nitride, concentration of nitrogen gas, introduction time thereof and the like.

By doping a single crystal ingot with nitrogen during its growth by the CZ method as described above, growth of crystal defects introduced during the crystal growth can be suppressed. Further, it is not required to use a low crystal growth rate, e.g., 0.4 mm/min or less, unlike the conventional method, and hence the productivity of crystals can be markedly improved. As a result, the productivity and cost of silicon wafers, the material of SOI substrates, can also be improved.

The reason why the crystal defect size is reduced by doping of silicon single crystal with nitrogen is considered that the vacancy aggregation process resulting formation of uniform nuclei shifts to one resulting formation of heterogeneous nuclei as described hereinbefore.

Therefore, the concentration of the doped nitrogen is preferably at a level sufficiently causing formation of heterogeneous nuclei, i.e., $1\times10^{10}$ atoms/cm$^3$ or more, more preferably $5\times10^{13}$ atoms/cm$^3$ or more. Such a concentration sufficiently suppresses the growth of crystal defects.

On the other hand, if the nitrogen concentration exceeds $5\times10^{15}$ atoms/cm$^3$, which is the solid solubility in silicon single crystal, crystallization of silicon single crystal itself is inhibited, and hence the nitrogen concentration is selected so that it should not exceed the aforementioned value.

According to the present invention, when the single crystal ingot doped with nitrogen is grown by the CZ method, concentration of oxygen contained in the single crystal ingot is preferably controlled to be $1.2\times10^{18}$ atoms/cm$^3$ or less.

Such low oxygen content in silicon single crystals can, together with the contained nitrogen, further suppress the formation of crystal defects, and suppress the formation of the aforementioned OSF. This makes it possible to further reduce crystal defects in the SOI layer.

During the growing of silicon single crystal ingot by the CZ method, the contained oxygen concentration can be lowered to the aforementioned range by a conventional method. For example, an oxygen concentration in the aforementioned range can be readily obtained by means of decreasing crucible rotation speed, increasing introduced gas flow, reducing atmospheric pressure, control of temperature distribution and convection of silicon melt, and the like.

As described above, a silicon single crystal ingot doped with nitrogen at a desired concentration and containing oxygen at a desired concentration can be obtained by the CZ method. Such an ingot can be sliced by a cutting machine such as inner diameter slicer or wire saw, and processed into a silicon single crystal wafer through various process steps such as chamfering, lapping, etching, and polishing in conventional manners. Of course, these steps are merely exemplary steps, and there can be various other steps such as cleaning. The steps may also be used in a suitably modified manner such as alteration of the step sequence and omission of some steps depending on the purpose.

Then, a bonded SOI substrate is produced by using the above-obtained silicon single crystal wafer at least as the device processing side wafer.

The method for producing the SOI substrate of the present invention will be explained by exemplifying a case where two pieces of silicon wafers are bonded with reference to the drawing. However, the present invention is not limited to the following explanation.

FIG. 1 illustrates exemplary process steps for producing the bonded SOI substrate of the present invention.

In FIG. 1, there are first provided the material wafers for producing an SOI substrate by bonding, a bond wafer 2 (device processing side wafer) and a base wafer 3 (FIG. 1(a)).

According to the present invention, the silicon single crystal wafer doped with nitrogen by the CZ method as described above is used at least as the bond wafer 2, which is a device processing side wafer. Of course, both of the two wafers may be those doped with nitrogen.

Among the provided silicon single crystal substrates, the bond wafer 2 is subjected to a heat treatment to form an oxide layer 4 on the bond wafer surface (FIG. 1(b)).

This heat treatment is performed at a high temperature, for example, 1000° C. or more, and the doped nitrogen is out-diffused during this treatment. Thus, the SOI layer does not contain nitrogen after it has been made thinner, and the produced devices are not harmfully affected.

In this step, the oxide layer may be formed on the base wafer 3, or on the both wafers. When the oxide layer is formed only on the base wafer 3, nitrogen in the bond wafer 2 will be out-diffused during a subsequent step, i.e., the heat treatment for bonding.

Then, the bond wafer 2 on which the oxide layer has been formed and the base wafer 3 are closely contacted with each other in a clean atmosphere (FIG. 1(c)). The bond wafer 2 and the base wafer 3 are firmly bonded by subjecting them to a heat treatment in an oxidizing atmosphere to form a bonded substrate 1. In this step, the bond wafer 2 and the base wafer 3 are firmly bonded, and an oxide film 5, which becomes an etching prevention film in a subsequent step, is formed on the whole external surface of the bonded substrate 1 (FIG. 1(d)).

As for the condition of the heat treatment for firmly bonding the two wafers, the heat treatment may be performed, for example, at a temperature in the range of 200 to 1200° C., preferably at a temperature of 900° C. or more, in an atmosphere containing oxygen or steam.

The above temperature range is defined because the heat treatment at a temperature in such a high temperature range can realize the bonding of the two wafers with sufficient strength, and surely out-diffuse nitrogen from the device processing side wafer.

Thus, the size of the grown-in defects contained in nitrogen-doped substrates is advantageously reduced, and harmful effects of nitrogen on electric characteristics of devices can completely be eliminated because the nitrogen has been out-diffused. In addition, harmful effects of oxygen are also eliminated because defects due to oxygen are unlikely to be formed around the bonding interface.

The bonded substrate 1 bonded as described above comprises unbonded portions of the bond wafer 2 and the base wafer 3 having a width of about 2 mm from the external periphery. Because such unbonded portions cannot be used as the SOI layer on which devices are formed, and in addition they may be delaminated in a subsequent step to cause various problems, they must be removed.

To remove the unbonded portions, an external periphery portion of the bond wafer 2 including the unbonded portion is first removed by grinding it to a predetermined thickness t as shown in FIG. 1(e). Grinding is preferred because it can realize rapid removal and good processing precision.

The predetermined thickness t is preferably made smaller as far as possible, because a smaller thickness t affords a thinner stock removal to be removed in the subsequent etching step.

Then, the unbonded portion at the periphery of the bond wafer 2 is completely removed by etching as shown in FIG. 1(f). This can be easily performed by immersing the bonded substrate 1 in an etching solution showing much larger etching rate as to silicon single crystal compared with the etching rate as to the oxide film. That is, the periphery of the bond wafer 2 is etched by the etching solution because silicon has been exposed by the grinding, whilst the other part of the surface of the bonded substrate 1 is not etched because it is covered with the oxide film 5. The etching may be the so-called alkali etching with KOH, NaOH and the like.

In this embodiment, because the thickness of the periphery of the bond wafer 2 is made sufficiently thinner, the unbonded portion present at the periphery of the bonded substrate 1 can be completely removed by etching in a short period of time.

Finally, the bond wafer 2 can be made thinner from its surface to a desired thickness by grinding, polishing or the like in a usual manner to prepare a bonded SOI substrate having an SOI layer 6 as shown in FIG. 1(g).

The method of the present invention is particularly advantageous when the SOI layer is made thinner to a thickness of 1 μm or less, because such a thin layer is likely to be penetrated by the crystal defects and hence suffer from pin holes.

While an embodiment where the bond wafer is made thinner by grinding, polishing and etching is explained in the above description, the present invention is not limited to the above explanation, and the bond wafer may be made thinner by any means that can make it thinner. In particular, the present invention is of course effective also for the case where the wafer is made thinner by the vapor phase etching, or the method where the wafers are implanted with ions, bonded together, and then delaminated, which are recently attracting attentions as techniques for producing an extremely thin SOI layer.

The vapor phase etching is one of the so-called dry etching methods, and it comprises, for example, determining thickness distribution of SOI layer on an SOI substrate, and running a cavity retaining plasma on the SOI substrate according to the layer thickness distribution. That is, the time for exposing the surface of the SOI layer to the plasma is controlled by the running speed, which is controlled according to the layer thickness distribution. As a result, the amount removed by etching is controlled to afford a uniform thickness of the SOI layer on the SOI substrate.

On the other hand, the method for producing an SOI substrate by bonding and separating wafers implanted with ions (technique called smart cut method) recently begins to attract attentions as a method for producing an SOI substrate. This method comprises forming an oxide layer on at least one silicon wafer among two pieces of silicon wafers, implanting hydrogen ions or rare gas ions from an upper surface of one wafer to form a fine bubble layer (encapsulation layer) in the wafer, closely contacting the surface implanted with the ions with the other silicon wafer so that the oxide layer should be interposed between them, subjecting the wafers to a heat treatment to delaminate one wafer into thin films at the fine bubble layer as a cleavage plane, and further subjecting the wafers to a heat treatment to firmly bond the wafers (see Japanese Patent Application Laid-open (KOKAI) No. 5-211128). The cleavage plane show good mirror surface, and thus an SOI substrate having an extremely thin SOI layer and exhibiting high uniformity of the layer thickness can be obtained relatively easily.

Further, because the SOI substrate produced by the process steps described above has a small crystal defect size, its crystal defects can be reduced by subjecting it to a heat treatment at 900° C. or higher, and thus an SOI substrate having extremely few crystal defects can be obtained. The atmosphere for the heat treatment is not particularly limited so long as the heat treatment temperature is 900° C. or higher, and hydrogen, argon, nitrogen, oxygen, mixed gas atmospheres thereof and the like can be used as the atmosphere for the heat treatment. However, migration of silicon atoms on the surface of the SOI layer becomes likely to occur in a reducing atmosphere containing hydrogen, and therefore such an atmosphere is particularly effective for reducing void type defects such as clusters of vacancies.

EXAMPLES

The present invention will be explained more specifically hereinafter with reference to examples of the present invention and comparative example, but the present invention is not limited to them.

Examples and Comparative Examples
(Growth of silicon single crystal ingots doped with nitrogen by the CZ method)

According to the CZ method, 40 kg of starting polycrystal silicon was charged in a quartz crucible having a diameter of 18 inches, and 10 ingots of P type having crystal orientation <100> and a diameter of 6 inches were pulled at various pulling rates within a range of usual pulling rate, 0.8–1.5 mm/min. For the pulling of 5 ingots among them, the starting material, polycrystal silicon, was melted together with silicon wafers having silicon nitride films of 0.12 g, whereas pulling of the remained 5 ingots did not use doping with nitrogen. For each crystal, the rotation of the crucible was controlled during the pulling so that the oxygen concentration in the single crystal should become $0.9$–$1.0 \times 10^{18}$ atoms/cm$^3$.

When the nitrogen concentration of the tail portions of the crystal ingots doped with nitrogen was measured by FT-IR, it was $5.0 \times 10^{14}$ atoms/cm$^3$ on average (since the segregation coefficient of nitrogen is extremely small, the concentration of the straight bodies of the crystal ingots would become smaller than that value). Further, oxygen concentration was measured by FT-IR for all of the single crystal ingots, and it was confirmed that the oxygen concentration was in the range of about $0.9$–$1.0 \times 10^{18}$ atoms/cm$^3$ for all of the crystals.

(Production of silicon single crystal wafers)

Wafers were sliced from the obtained single crystal ingots by using a wire saw, and processed by chamfering, lapping, etching, and mirror polishing in the substantially same conditions to afford two kinds of mirror surface silicon single crystal wafers having a diameter of 6 inches, which were different in either they were doped or not doped with nitrogen.

The silicon single crystal wafers obtained above were subjected to Secco etching, and the pit density was measured by microscopy to determine the density of crystal defects (grown-in defects).

Figure 2:
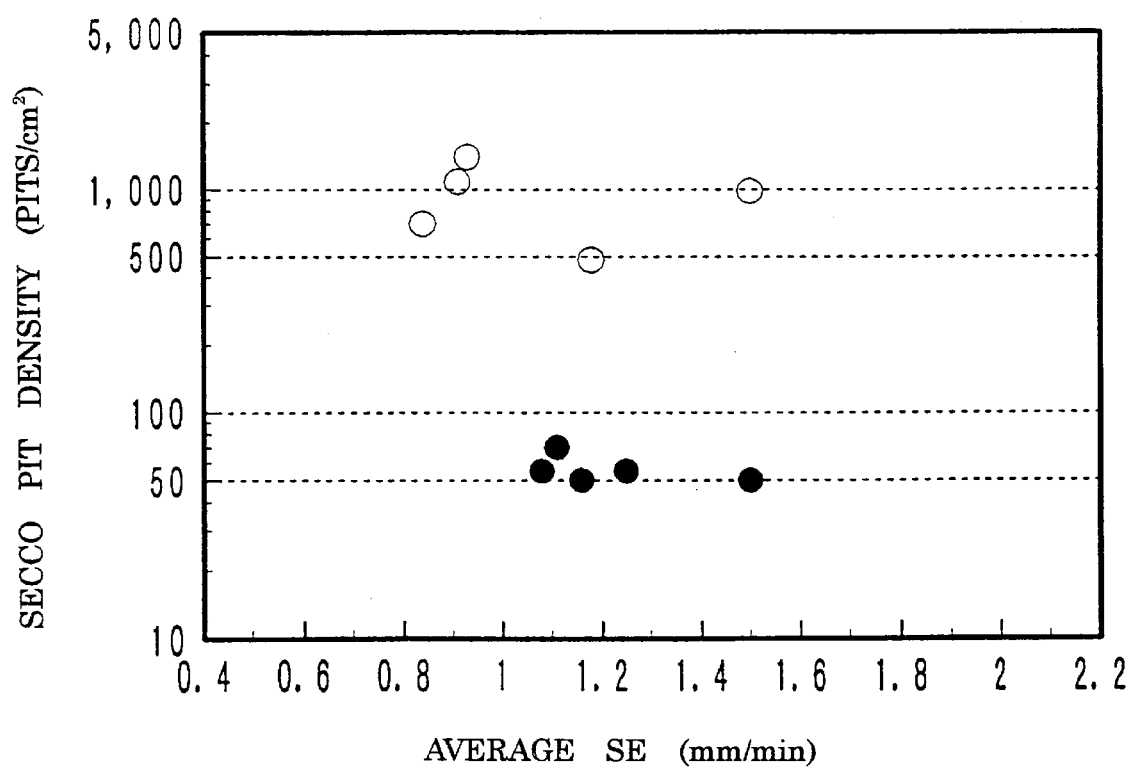
FIG. 2 is a graph showing the results of measurement of pit density by microscopy of surfaces of silicon wafers of examples and comparative examples after Secco etching. The black circles represent the results of the wafers doped with nitrogen, and the white circles represent the results of the wafers not doped with nitrogen.

The results of the measurement are shown in FIG. 2. The black circles represent the results of the wafers doped with nitrogen, and the white circles represent the results of the wafers not doped with nitrogen.

It can be seen from these results that the crystal defect density of the wafers doped with nitrogen was reduced to about one-20th of that obtained by the conventional method, despite the fact that the pulling was performed at a rate of 1.0 mm/min or more, equivalent to or higher than the conventional rate. That is, it can be seen that the doping with nitrogen suppressed growth of crystal defects, and reduced crystal defects of detectable size.

(Production of SOI substrates)

Then, by using the wafers mentioned above, SOI substrates were produced according to the process steps shown in FIG. 1. Wafers doped with nitrogen were used for both of the bond wafer and the base wafer in the examples, and wafers not doped with nitrogen were used for both of the bond wafer and the base wafer in the comparative examples.

Each bond wafer was subjected to a heat treatment at 1050° C. in an atmosphere containing oxygen to form an oxide layer having a thickness of 0.2 μm on the surface of the bond wafer, and closely contacted with a base wafer, and they were firmly bonded by a heat treatment for bonding at 1100° C. for 2 minutes. Then, the bond wafer was ground and polished, and subjected to vapor phase etching to produce an SOI substrate having an SOI layer of a thickness of about 0.2 μm.

If the SOI substrate obtained as described above has defects penetrating the SOI layer, etch pits would be formed when the substrate is immersed in 50% aqueous solution of HF for 10 minutes, since HF reaches the buried oxide layer through the penetrating defects and etches the oxide layer. Since these etch pits formed on the oxide layer can be observed by an optical microscope through the thin SOI layer, the number of the pits in regions of about 10 cm$^2$ in total was determined by scanning the wafer surface along the direction of its diameter.

As a result of the measurement, 0.2 pits/cm$^2$ on average was found in the examples, and 0.8 pits/cm$^2$ on average in the comparative examples. Therefore, it was found that the formation of pin holes due to the crystal defects in the SOI layer could be markedly improved by the present invention.

An SOI substrate having a thickness of 0.2 μm, which had been produced under the same conditions as those used for the aforementioned SOI substrates (doped with nitrogen), was subjected to a heat treatment at 1200° C. for 10 seconds in an atmosphere of 100% hydrogen using a lamp heater (Steag Microtech International Corporation, SHS-2800). Then, this substrate was evaluated for etch pits formed with HF aqueous solution in the same manner as described above, and it was found that the defect density was 0.03 pits/cm². Thus, it was found that the defects in the SOI layer were further reduced.

The present invention is not limited to the embodiments described above. The above-described embodiments are mere examples, and any of those having the substantially same structure as that described in the appended claims and providing the similar functions and advantages are included in the scope of the present invention.

For example, when a silicon single crystal is grown by the Czochralski method according to the present invention, the melt may or may not be applied with a magnetic field, and therefore the Czochralski method used for the present invention include the so-called MCZ method in which a magnetic field is applied.

Further, though it was demonstrated that the crystal defects can further be reduced at a low concentration of the contained oxygen in the above description, the present invention can of course afford the advantages at a higher oxygen concentration, e.g., 1.2 to $1.5 \times 10^{18}$ atoms/cm³ or higher.

Further, the aforementioned embodiment was explained mainly for the case where two pieces of silicon wafers are bonded to produce an SOI substrate, but the present invention is of course effective for reducing crystal defects in the SOI layer also in a case where a silicon wafer produced by the CZ method and an insulator substrate made of quartz, silicon carbide, silicon nitride, alumina, sapphire, other ceramic materials or the like are bonded to form a bonded SOI substrate, and applicable to such a case.

What is claimed is:

1. A method for producing an SOI substrate comprising forming an oxide layer on a surface of at least one silicon wafer among two silicon wafers, closely contacting one wafer with the other wafer so that the oxide layer should be interposed between them, subjecting the wafers to a heat treatment to firmly bond the wafers, and making a device processing side wafer thinner, wherein a silicon single crystal wafer obtained by growing a silicon single crystal ingot doped with nitrogen by the Czochralski method, and slicing the single crystal ingot into a silicon single crystal wafer is used as the device processing side wafer.

2. The method for producing an SOI substrate according to claim 1, wherein, when the silicon single crystal ingot doped with nitrogen is grown by the Czochralski method, concentration of nitrogen doped into the single crystal ingot is controlled to be in a range of $1 \times 10^{10}$ to $5 \times 10^{15}$ atoms/cm³.

3. The method for producing an SOI substrate according to claim 1, wherein, when the single crystal ingot doped with nitrogen is grown by the Czochralski method, concentration of oxygen contained in the single crystal ingot is controlled to be $1.2 \times 10^{18}$ atoms/cm³ or less.

4. The method for producing an SOI substrate according to claim 1, wherein the heat treatment for obtaining firm bonding is performed at a temperature of 900° C. or more.

5. The method for producing an SOI substrate according to claim 1, wherein the device processing side wafer is made thinner to a thickness of 1 μm or less.

6. The method for producing an SOI substrate according to claim 1, wherein, after the device processing side wafer is made thinner, the heat treatment is performed at a temperature of 900° C. or more.

7. An SOI substrate which has been produced by the method according to claim 1.

8. A method for producing an SOI substrate comprising closely contacting a silicon wafer and an insulator substrate, subjecting them to a heat treatment to firmly bond them, and making the silicon wafer that is a device processing side wafer thinner, wherein a silicon single crystal wafer obtained by growing a silicon single crystal ingot doped with nitrogen by the Czochralski method, and slicing the single crystal ingot into a silicon single crystal wafer is used as the silicon wafer that is the device processing side wafer.

9. The method for producing an SOI substrate according to claim 8, wherein, when the silicon single crystal ingot doped with nitrogen is grown by the Czochralski method, concentration of nitrogen doped into the single crystal ingot is controlled to be in a range of $1 \times 10^{10}$ to $5 \times 10^{15}$ atoms/cm³.

10. The method for producing an SOI substrate according to claim 8, wherein, when the single crystal ingot doped with nitrogen is grown by the Czochralski method, concentration of oxygen contained in the single crystal ingot is controlled to be $1.2 \times 10^{18}$ atoms/cm³ or less.

11. The method for producing an SOI substrate according to claim 8, wherein the heat treatment for obtaining firm bonding is performed at a temperature of 900° C. or more.

12. The method for producing an SOI substrate according to claim 2, wherein the device processing side wafer is made thinner to a thickness of 1 μm or less.

13. The method for producing an SOI substrate according to claim 8, wherein, after the device processing side wafer is made thinner, the heat treatment is performed at a temperature of 900° C. or more.

14. An SOI substrate which has been produced by the method according to claim 8.

* * * * *